(12) United States Patent
Kim et al.

(10) Patent No.: US 8,729,692 B2
(45) Date of Patent: May 20, 2014

(54) POWER MODULE PACKAGE

(75) Inventors: Kwang Soo Kim, Gyunggi-do (KR);
Young Hoon Kwak, Gyunggi-do (KR);
Young Ki Lee, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 65 days.

(21) Appl. No.: 13/353,128

(22) Filed: Jan. 18, 2012

(65) Prior Publication Data

US 2013/0134571 A1    May 30, 2013

(30) Foreign Application Priority Data

Nov. 28, 2011   (KR) ......................... 10-2011-0125305

(51) Int. Cl.
*H01L 23/48* (2006.01)
*H01L 23/52* (2006.01)

(52) U.S. Cl.
USPC ................. 257/690; 438/106; 257/E23.08

(58) Field of Classification Search
USPC ................... 257/701–733, 666–678
See application file for complete search history.

(56) References Cited

U.S. PATENT DOCUMENTS

| 5,111,280 A | * | 5/1992 | Iversen .......................... 257/713 |
| 7,990,711 B1 | | 8/2011 | Andry et al. |
| 2008/0224303 A1 | | 9/2008 | Funakoshi et al. |

FOREIGN PATENT DOCUMENTS

KR   1020040064995 A   7/2007

OTHER PUBLICATIONS

EP12151294 European Search Report dated Oct. 11, 2013; 9pgs.

* cited by examiner

*Primary Examiner* — Sonya D McCall Shepard
(74) *Attorney, Agent, or Firm* — Bracewell & Giuliani LLP; Brad Y. Chin

(57) ABSTRACT

Disclosed herein is a power module package including: a first heat dissipation plate including a first flow path, a second flow path, and a third flow path which are sequentially formed, the first flow path and the third flow path being formed to have a step therebetween; and a second heat dissipation plate formed under the first heat dissipation plate, having one face and the other face, having a semiconductor device mounting groove formed in the one face thereof, and including a fourth flow path having one end connected to the second flow path and the other end connected to the third flow path, wherein a cooling material introduced through the first flow path is distributed to the third flow path and the fourth flow path based on the second flow path.

16 Claims, 2 Drawing Sheets

POWER MODULE PACKAGE

CROSS REFERENCE TO RELATED APPLICATION

This application claims the benefit of Korean Patent Application No. 10-2011-0125305, filed on Nov. 28, 2011, entitled "Power Module Package", which is hereby incorporated by reference in its entirety into this application.

BACKGROUND OF THE INVENTION

1. Technical Field

The present invention relates to a power module package.

2. Description of the Related Art

Due to the increase of energy consumption throughout the world, people have started to show great interest in how to efficiently use limited energy. In line with extensive applications of power modules, multifunctional and compact power modules are currently in demand, but a problem of heat generation of electronic components in response to the multifunction and reduction in size results in a degradation of the overall performance of modules.

Thus, in order to increase the efficiency and obtain high reliability of power modules, a highly dissipating water cooling power module package structure capable of solving the foregoing heat generation problem is required.

In general, as disclosed in Document 1, a heat dissipation system is formed by separately fabricating a power module package and a heat dissipation system and then coupling them, and here, fabrication unit cost of the power module package and that of the heat dissipation system are high and it is not easy to change design of a water cooling channel for enhancing heat dissipation efficiency of the heat dissipation system, thereby making it difficult to apply various modules thereto and effectively dissipate heat.

Also, the heat dissipation system having the foregoing structure dissipates only one face in terms of the structure of the power module, which can hardly be applied to a power module package employing a high heating insulated gate bipolar transistor (IGBT) applied to various fields including electric vehicles, industries, renewable purpose, and the like, and such low heat dissipation makes it difficult to highly integrate high heating semiconductor devices.

[Document 1] KR 10-2004-0064995 A Jul. 21, 2004

SUMMARY OF THE INVENTION

The present invention has been made in an effort to provide a power module package that can be highly integrated, reduced in size and can be lightweight by employing a heat dissipation plate which can serve as a substrate including a cooling flow path having a form when upper and lower portions are integrated.

According to a first preferred embodiment of the present invention, there is provided a power module package including: a first heat dissipation plate including a first flow path, a second flow path, and a third flow path which are sequentially formed, the first flow path and the third flow path being formed to have a step therebetween; a second heat dissipation plate formed under the first heat dissipation plate, having one face and the other face, having a semiconductor device mounting groove formed in the one face thereof, and including a fourth flow path having one end connected to the second flow path and the other end connected to the third flow path; insulating layers formed on the first heat dissipation plate and the second heat dissipation plate; metal layers including a circuit pattern and a connection pad formed on the insulating layers; and a semiconductor device formed on the metal layers, wherein a cooling material introduced through the first flow path is distributed to the third flow path and the fourth flow path based on the second flow path.

The first heat dissipation plate and the second heat dissipation plate may be made of a metallic material.

The semiconductor device may include a power element and a control element.

When the semiconductor device is a power element, the semiconductor device may be formed between the metal layer of the first heat dissipation plate and that of the second heat dissipation plate.

The cooling material may be water or a refrigerant.

The insulating layers may be made of a ceramic material.

The first flow path may be a region to which the cooling material is introduced, and the third flow path may be a region from which the cooling material is discharged.

The insulating layers may be formed on opposite faces of the first heat dissipation plate and the second heat dissipation plate.

The semiconductor device may be formed to be positioned in the semiconductor device mounting groove.

The power module package may further include: an adhesive layer formed between the semiconductor device and the metal layer.

The first flow path, the second flow path, and the third flow path may be formed to be sequentially connected at the center of the first heat dissipation plate based on a thicknesswise direction thereof.

The second flow path and the third flow path may have holes formed at portions thereof each in contact with the fourth flow path, toward the second heat dissipation plate.

The fourth flow path may be formed at the center of the second heat dissipation plate based on a thicknesswise direction thereof.

The second heat dissipation plate may further include a first connection portion formed to be connected to one end of the fourth flow path of one face thereof and including a first connection groove corresponding to the first flow path, the second flow path, the third flow path, and the fourth flow path.

The second heat dissipation plate may further include a second connection portion formed to be connected to the other end of the fourth flow path of one face thereof and including a second connection groove corresponding to the third flow path and the fourth flow path.

According to a second preferred embodiment of the present invention, there is provided a power module package including: a first heat dissipation plate including a first flow path, a second flow path, and a third flow path which are sequentially formed, the first flow path and the third flow path being formed to have a step therebetween; and a second heat dissipation plate formed under the first heat dissipation plate, having one face and the other face, having a semiconductor device mounting groove formed in the one face thereof, and including a fourth flow path having one end connected to the second flow path and the other end connected to the third flow path, wherein a cooling material introduced through the first flow path is distributed to the third flow path and the fourth flow path based on the second flow path, and the second heat dissipation plate includes a first connection portion formed to be connected to one end of the fourth flow path of one face thereof and including a first connection groove corresponding to the first flow path, the second flow path, the third flow path, and the fourth flow path, and a second connection portion formed to be connected to the other end of the fourth flow path of one face thereof and including a second connection groove corresponding to the third flow path and the fourth flow path.

The power module package may further include: insulating layers formed on the first heat dissipation plate and the second heat dissipation plate; metal layers including a circuit pattern and a connection pad formed on the insulating layers; and a semiconductor device formed on the metal layers.

DESCRIPTION OF THE PREFERRED EMBODIMENTS

Figure 1:
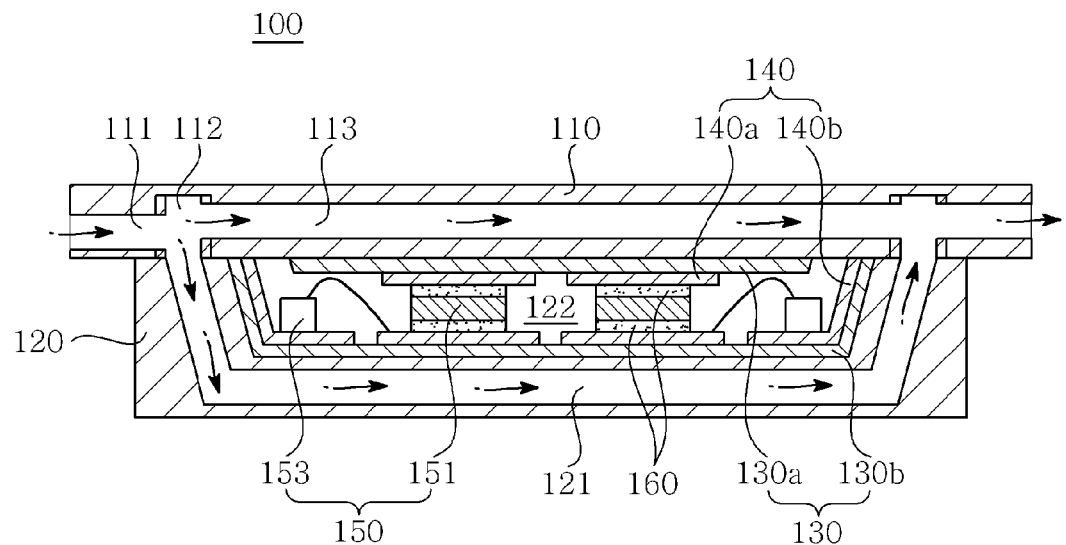
FIG. 1 is a detailed sectional view showing the configuration of a power module package according to a preferred embodiment of the present invention.

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. In the description, the terms "first", "second", "one surface", "the other surface" and so on are used to distinguish one element from another element, and the elements are not defined by the above terms. In describing the present invention, a detailed description of related known functions or configurations will be omitted so as not to obscure the gist of the present invention.

Hereinafter, preferred embodiments of the present invention will be described in detail with reference to the accompanying drawings.

Power Module Package

Figure 2:
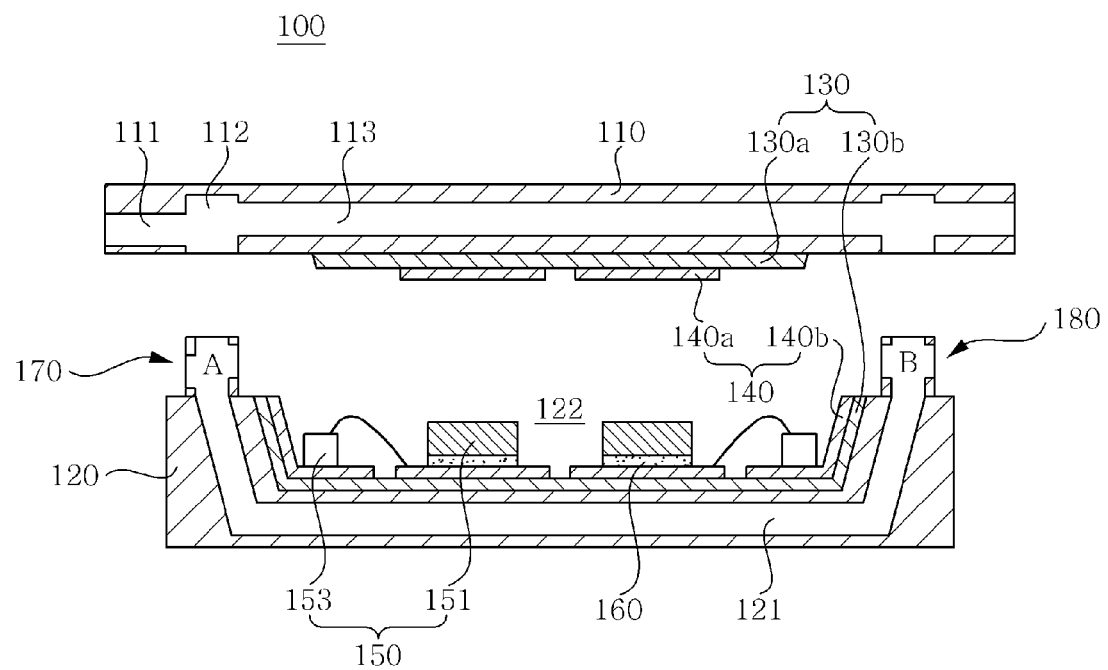
FIG. 2 is a detailed sectional view showing the configuration before first and second heat dissipation plates are coupled according to a preferred embodiment of the present invention.
Figure 3:
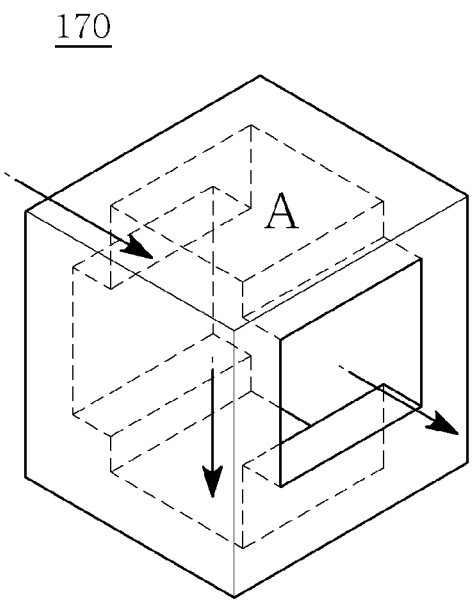
FIG. 3 is a view showing the configuration of a first connection portion according to a preferred embodiment of the present invention.
Figure 4:
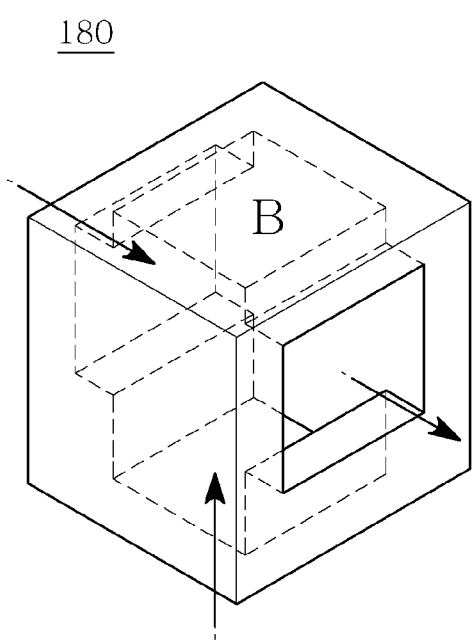
FIG. 4 is a view showing the configuration of a second connection portion according to a preferred embodiment of the present invention.

FIG. 1 is a detailed sectional view showing the configuration of a power module package according to a preferred embodiment of the present invention. FIG. 2 is a detailed sectional view showing the configuration before first and second heat dissipation plates are coupled according to a preferred embodiment of the present invention. FIG. 3 is a view showing the configuration of a first connection region according to a preferred embodiment of the present invention. FIG. 4 is a view showing the configuration of a second connection region according to a preferred embodiment of the present invention.

As shown in FIG. 1, a power module package 100 includes a first heat dissipation plate 110 including a first flow path 111, a second flow path 112, and a third flow path 113 which are sequentially formed, in which the first flow path 111 and the third flow path 113 are formed to have a step therebetween, and a second heat dissipation plate 120 formed under the first heat dissipation plate 110, having one face and the other face, having a semiconductor device mounting groove 122 formed in the one face thereof, and including a fourth flow path 121 having one end connected to the second flow path 112 and the other end connected to the third flow path 113.

Here, a cooling material introduced through the first flow path 111 may be distributed to the third flow path 113 and the fourth flow path 121 based on the second flow path 112.

The cooling material may include water or a refrigerant, but the present invention is not limited thereto and any material may be used as a cooling material so long as it can flow along a flow path to dissipate heat generated in the power module package 100.

Also, as shown in FIG. 1, the first flow path 111 may be a region to which the cooling material is introduced, and the third flow path 113 may be a region from which the cooling material is discharged.

Namely, the power module package 100 according to a preferred embodiment of the present invention includes the flow paths formed at upper and lower portions thereof, but an inflow portion and an outflow portion of the flow paths are integrated.

As shown in FIGS. 1 and 2, the first flow path 111, the second flow path 112, and the third flow path 113 may be formed to be sequentially connected at the center of the first heat dissipation plate 110 based on a thicknesswise direction thereof.

Also, the second flow path 112 and the third flow path 113 may have holes formed at portions each in contact with the fourth flow path 121. Here, the holes may be formed toward the second heat dissipation plate 120.

With such a structure, as shown in FIG. 1, a cooling material introduced through the first flow path 111 is distributed to the third flow path 113 and the fourth flow path 121 based on the second flow path 112.

Also, the cooling material introduced into the fourth flow path 121 is discharged through the third flow path 113.

As described above, the first flow path 111 and the third flow path 113 have a step therebetween based on the second flow path 112 in order to equally distribute the cooling material.

In the structure, a cooling material inflow resistance of the third flow path 113 is increased to accelerate introduction of the cooling material into the fourth flow path 121 corresponding to a lower flow path by gravitation, thus allowing the cooling material to be equally distributed into the upper and lower portions (i.e., the third flow path and the fourth flow path) of the power module package.

Here, the degree of the step between the first flow path 111 and the second flow path 113 may be designated such that the same resistance can be applied to the cooling material introduced to the third flow path 113 and to the fourth flow path 121.

The fourth flow path 121 may be formed at the center of the second heat dissipation plate 120 based on the thicknesswise direction thereof.

Namely, as for the first to fourth flow paths 111, 112, 113, and 121 in the foregoing structure, since the cooling material is introduced through one entrance and discharged through one exit, there is no need to separately form an entrance and an exit for the first heat dissipation plate 110 and the second heat dissipation plate 120, so the area otherwise occupied by the entrance and the exit can be saved.

Thus, the power module package 110 can be highly integrated, can have a smaller size, and can become lightweight.

Also, the power module package 100 may include insulating layers 130 (130a and 130b) formed on the first heat dissipation plate 110 and the second heat dissipation plate 120, metal layers 140 including circuit patterns and connection pads formed on the insulating layers 130 (130a and 130b), and a semiconductor device 150 formed on the metal layers 140.

The first heat dissipation plate 110 and the second heat dissipation plate 120 may be made of a metallic material.

For example, the metallic material may be aluminum (Al), but the present invention is not limited thereto.

The insulating layers 130 (130a and 130b) may be made of a ceramic material, but the present invention is not limited thereto.

Here, the insulating layers 130 (130a and 130b) may be formed on the opposite faces of the heat dissipation plate 110 and the second heat dissipation plate 120.

Namely, as shown in FIG. 1, the insulating layers 130 (130a and 130b) formed on the heat dissipation plate 110 and the second heat dissipation plate 120 are formed on the opposite faces in the semiconductor device mounting groove 122.

The semiconductor device 150 may include a power element 151 and a control element 153.

Here, it is may be defined that the power element 151 refers to an element, such as an insulated gate bipolar transistor (IGBT), a diode, or the like, generating a great amount of heat, and the control element 153 refers to an element, such as a control integrated circuit (IC), which generates a small amount of heat in comparison to the power element generating a great amount of heat.

When the semiconductor device 150 is the power element 151, as shown in FIG. 1, the semiconductor 150 may be formed between a metal layer 140a of the first heat dissipation plate 110 and a metal layer 140b of the second heat dissipation plate 120.

Also, the semiconductor device 150 may be formed to be placed in the semiconductor device mounting groove 122.

Also, the power module package 100 may further include an adhesive layer 160 formed between the semiconductor device 150 and the metal layer 140.

Meanwhile, as shown in FIGS. 2 through 4, the second heat dissipation plate 120 may further include a first connection portion 170 formed to be connected to one end of the fourth flow path 121 of one face thereof and including a first connection groove A corresponding to the first flow path 111, the second flow path 112, the third flow path 113, and the fourth flow path 121.

Also, the second heat dissipation plate 120 may further include a second connection portion 180 formed to be connected to the other end of the fourth flow path 121 of one face thereof and including a second connection groove B corresponding to the third flow path 113 and the fourth flow path 121.

Here, it may be defined that, the first connection groove A and the second connection groove B correspond to the first to fourth flow paths 111, 112, 113, and 121 means that the first connection groove A and the second connection groove B are formed in the first connection portion 170 and the second connection portion 180 such that they do not hamper the flow of the cooling material in the first to fourth flow paths 111, 112, 113, and 121.

The sizes of the first connection portion 170 and the second connection portion 180 may be determined in consideration of the sizes of the corresponding regions of the first heat dissipation plate 110 into which the first connection portion 170 and the second connection portion 180 are to be inserted.

For example, the first connection portion 170 may be formed to be smaller than the second flow path 112. Here, in order to maintain a reliable coupled state of the first heat dissipation plate 110 and the second heat dissipation plate 120, the size of the first connection portion 170 may be substantially equal to that of the second flow path 112, and in this case, the first connection portion 170 may be formed to be so small as to be sufficiently inserted into the second flow path 112.

The foregoing first connection portion 170 and the second connection portion 180 are formed to be protruded from one face of the second heat dissipation plate 120 and connected to one end and the other end of the fourth flow path 121.

The second heat dissipation plate 120 is coupled to the first heat dissipation plate 110 through the first connection portion 170 and the second connection portion 180.

Here, since the second heat dissipation plate 120 is coupled by inserting the first and second connection portions 170 and 180 into the second flow path 112 of the first heat dissipation plate 110, the first heat dissipation plate 110 and the second heat dissipation plate 120 can be easily aligned, and accordingly, the process of coupling the components of the power module package can be simplified.

According to embodiments of the present invention, since the heat dissipation plate integrating the role of a heat sink and the role of a substrate is implemented and the semiconductor device is directly mounted on the heat dissipation plate, a thermal resistance interface can be reduced and heat generated from the semiconductor device can be quickly dissipated in comparison to the related art. Thus, the performance of the power module package can be enhanced.

Also, in view of the foregoing heat sink and substrate-integrated structure, the semiconductor device as well as the power element and the control element mounted on the power module package can be highly integrated.

In addition, an additional implement such as a connection member, or the like, for connecting the first heat dissipation plate and the second heat dissipation plate is omitted, the power module package can become smaller and lighter.

According to the preferred embodiments of the present invention, in the power module package, since an integrated cooling flow path allowing a cooling material to flow therealong is formed within a heat dissipation plate including a role of a substrate is formed, the power module package can be highly integrated, can have a smaller size, and can become lightweight.

Also, since the cooling flow path allowing a cooling material flow therealong is applied to both upper and lower portions, heat of a semiconductor device which generates a great amount of heat can be effectively dissipated, thus enhancing performance of the power module package.

Although the embodiment of the present invention has been disclosed for illustrative purposes, it will be appreciated that a power module package according to the invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A power module package comprising:
   a first heat dissipation plate including a first flow path, a second flow path, and a third flow path which are sequentially formed, the first flow path and the third flow path being formed to have a step therebetween;
   a second heat dissipation plate formed under the first heat dissipation plate, having one face and the other face, having a semiconductor device mounting groove formed in the one face thereof, and including a fourth flow path having one end connected to the second flow path and the other end connected to the third flow path;
   insulating layers formed on the first heat dissipation plate and the second heat dissipation plate;
   metal layers including a circuit pattern and a connection pad formed on the insulating layers; and
   a semiconductor device formed on the metal layers,
   wherein a cooling material introduced through the first flow path is distributed to the third flow path and the fourth flow path based on the second flow path, and
   wherein the first flow path, the second flow path, and the third flow path are formed to be sequentially connected at the center of the first heat dissipation plate based on a thicknesswise direction thereof.

2. The power module package as set forth in claim 1, wherein the first heat dissipation plate and the second heat dissipation plate are made of a metallic material.

3. The power module package as set forth in claim 1, wherein the semiconductor device includes a power element and a control element.

4. The power module package as set forth in claim 1, wherein when the semiconductor device is a power element, the semiconductor device is formed between the metal layer of the first heat dissipation plate and that of the second heat dissipation plate.

5. The power module package as set forth in claim 1, wherein the cooling material is water or a refrigerant.

6. The power module package as set forth in claim 1, wherein the insulating layers are made of a ceramic material.

7. The power module package as set forth in claim 1, wherein the first flow path is a region to which the cooling material is introduced, and the third flow path is a region from which the cooling material is discharged.

8. The power module package as set forth in claim 1, wherein the insulating layers are formed on opposite faces of the first heat dissipation plate and the second heat dissipation plate.

9. The power module package as set forth in claim 1, wherein the semiconductor device is formed to be positioned in the semiconductor device mounting groove.

10. The power module package as set forth in claim 1, further comprising:
    an adhesive layer formed between the semiconductor device and the metal layer.

11. A power module package comprising:
    a first heat dissipation plate including a first flow path, a second flow path, and a third flow path which are sequentially formed, the first flow path and the third flow path being formed to have a step therebetween;
    a second heat dissipation plate formed under the first heat dissipation plate, having one face and the other face, having a semiconductor device mounting groove formed in the one face thereof, and including a fourth flow path having one end connected to the second flow path and the other end connected to the third flow path;
    insulating layers formed on the first heat dissipation plate and the second heat dissipation plate;
    metal layers including a circuit pattern and a connection pad formed on the insulating layers; and
    a semiconductor device formed on the metal layers,
    wherein a cooling material introduced through the first flow path is distributed to the third flow path and the fourth flow path based on the second flow path, and
    wherein the second flow path and the third flow path have holes formed at portions thereof each in contact with the fourth flow path, toward the second heat dissipation plate.

12. A power module package comprising:
    a first heat dissipation plate including a first flow path, a second flow path, and a third flow path which are sequentially formed, the first flow path and the third flow path being formed to have a step therebetween;
    a second heat dissipation plate formed under the first heat dissipation plate, having one face and the other face, having a semiconductor device mounting groove formed in the one face thereof, and including a fourth flow path having one end connected to the second flow path and the other end connected to the third flow path;
    insulating layers formed on the first heat dissipation plate and the second heat dissipation plate;
    metal layers including a circuit pattern and a connection pad formed on the insulating layers; and
    a semiconductor device formed on the metal layers,
    wherein a cooling material introduced through the first flow path is distributed to the third flow path and the fourth flow path based on the second flow path, and
    wherein the fourth flow path is formed at the center of the second heat dissipation plate based on a thicknesswise direction thereof.

13. A power module package comprising:
    a first heat dissipation plate including a first flow path, a second flow path, and a third flow path which are sequentially formed, the first flow path and the third flow path being formed to have a step therebetween;
    a second heat dissipation plate formed under the first heat dissipation plate, having one face and the other face, having a semiconductor device mounting groove formed in the one face thereof, and including a fourth flow path having one end connected to the second flow path and the other end connected to the third flow path;
    insulating layers formed on the first heat dissipation plate and the second heat dissipation plate;
    metal layers including a circuit pattern and a connection pad formed on the insulating layers; and
    a semiconductor device formed on the metal layers,
    wherein a cooling material introduced through the first flow path is distributed to the third flow path and the fourth flow path based on the second flow path, and
    wherein the second heat dissipation plate further includes a first connection portion formed to be connected to one end of the fourth flow path of one face thereof and including a first connection groove corresponding to the first flow path, the second flow path, the third flow path, and the fourth flow path.

14. A power module package comprising:
    a first heat dissipation plate including a first flow path, a second flow path, and a third flow path which are sequentially formed, the first flow path and the third flow path being formed to have a step therebetween;
    a second heat dissipation plate formed under the first heat dissipation plate, having one face and the other face, having a semiconductor device mounting groove formed in the one face thereof, and including a fourth flow path having one end connected to the second flow path and the other end connected to the third flow path;

insulating layers formed on the first heat dissipation plate and the second heat dissipation plate;

metal layers including a circuit pattern and a connection pad formed on the insulating layers; and a semiconductor device formed on the metal layers, wherein a cooling material introduced through the first flow path is distributed to the third flow path and the fourth flow path based on the second flow path, and wherein the second heat dissipation plate further includes a second connection portion formed to be connected to the other end of the fourth flow path of one face thereof and including a second connection groove corresponding to the third flow path and the fourth flow path.

15. A power module package comprising:

a first heat dissipation plate including a first flow path, a second flow path, and a third flow path which are sequentially formed, the first flow path and the third flow path being formed to have a step therebetween; and a second heat dissipation plate formed under the first heat dissipation plate, having one face and the other face, having a semiconductor device mounting groove formed in the one face thereof, and including a fourth flow path having one end connected to the second flow path and the other end connected to the third flow path, wherein a cooling material introduced through the first flow path is distributed to the third flow path and the fourth flow path based on the second flow path, and the second heat dissipation plate includes a first connection portion formed to be connected to one end of the fourth flow path of one face thereof and including a first connection groove corresponding to the first flow path, the second flow path, the third flow path, and the fourth flow path, and a second connection portion formed to be connected to the other end of the fourth flow path of one face thereof and including a second connection groove corresponding to the third flow path and the fourth flow path.

16. The power module package as set forth in claim 15, further comprising:

insulating layers formed on the first heat dissipation plate and the second heat dissipation plate;

metal layers including a circuit pattern and a connection pad formed on the insulating layers; and a semiconductor device formed on the metal layers.

\* \* \* \* \*